(12) United States Patent
Lutz

(10) Patent No.: US 9,123,808 B2
(45) Date of Patent: Sep. 1, 2015

(54) TUCK STRATEGY IN TRANSISTOR MANUFACTURING FLOW

(71) Applicant: GLOBALFOUNDRIES Inc., Grand Cayman (KY)

(72) Inventor: Robert Lutz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 131 days.

(21) Appl. No.: 14/076,562

(22) Filed: Nov. 11, 2013

(65) Prior Publication Data

US 2015/0129933 A1     May 14, 2015

(51) Int. Cl.
*H01L 29/66*     (2006.01)
*H01L 29/78*     (2006.01)
*H01L 21/762*    (2006.01)

(52) U.S. Cl.
CPC ...... *H01L 29/7848* (2013.01); *H01L 21/76224* (2013.01); *H01L 29/66568* (2013.01); *H01L 29/7846* (2013.01)

(58) Field of Classification Search
CPC ..................... H01L 29/7848; H01L 29/66568; H01L 21/76224; H01L 29/7846
USPC .......................................... 438/197; 257/340
See application file for complete search history.

(56) References Cited

U.S. PATENT DOCUMENTS

| 2013/0065371 A1 | 3/2013 | Wei et al. | |
| 2014/0097496 A1* | 4/2014 | Hu et al. | 257/368 |

* cited by examiner

*Primary Examiner* — David Vu
(74) *Attorney, Agent, or Firm* — Amerson Law Firm, PLLC

(57) ABSTRACT

When forming field effect transistors with a semiconductor alloy layer, e.g., SiGe, embedded in the source/drain regions, a strategy called tucking has been developed in order to improve formation of the semiconductor alloy layer. An improved tucking strategy is hereby proposed, wherein the interface between the isolation region and the active region is not straight, but it rather defines an indentation, so that the active region protrudes into the isolation region in correspondence to the indentation. A gate is then formed on the surface of the device in such a way that a portion of the indentation is covered by the gate. An etching process is then performed, during which the gate acts as a screen. The etching thus gives rise to a cavity defined by a sidewall comprising portions exposing silicon, alternated to portions exposing the dielectric material of the isolation region.

22 Claims, 10 Drawing Sheets

TUCK STRATEGY IN TRANSISTOR MANUFACTURING FLOW

BACKGROUND OF THE INVENTION

1. Field of the Invention

Generally, the present disclosure relates to integrated circuits, and, more particularly, to transistors comprising a semiconductor alloy embedded in their respective source/drain regions.

2. Description of the Related Art

Transistors are the dominant components in modern electronic devices. Currently, several hundred millions of transistors may be provided in presently available complex integrated circuits, such as microprocessors, CPUs, storage chips and the like. It is then crucial that the typical dimensions of the transistors included in an integrated circuit are as small as possible, so as to enable a high integration density.

One of the most widespread semiconductor fabrication technologies is the complementary metal-oxide-semiconductor (CMOS) technology, wherein complementary field effect transistors (FETs), i.e., P-channel FETs and N-channel FETs, are used for forming circuit elements, such as inverters and other logic gates, to design highly complex circuit assemblies.

Transistors are usually formed in active regions defined within a semiconductor layer supported by a substrate. Presently, the layer in which most integrated circuits are formed is made out of silicon, which may be provided in crystalline, polycrystalline or amorphous form. Other materials such as, for example, dopant atoms or ions may be introduced into the original semiconductor layer.

A MOS field effect transistor (MOSFET), or generally a FET, irrespective of whether an N-channel FET or a P-channel FET is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

However, reduction of transistor channel length may not be pushed to extreme limits without incurring other problems. For example, the capacitance between the gate electrode and the channel decreases with decreasing channel length. A solution to this problem consists in the so-called high-k/metal gate (HKMG) technology, which has become the standard manufacturing technology for transistors with gate lengths less than about 50 nm. According to the HKMG manufacturing process flow, the insulating layer separating the gate electrode from the channel region is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. By high-k material, it is here referred to a material with a dielectric constant "k" greater than 10.

One more approach developed in order to increase the charge carrier mobility in the channel region consists of generating a certain type of strain in the channel region, since the charge carrier mobility in silicon strongly depends on the strain conditions of the crystalline material. This approach may be conveniently used in conjunction with the HKMG technology or with the conventional poly/SiON method.

Strain has been extensively used in semiconductor manufacturing based on the experimental finding that a compressive strain component in the channel region of a P-channel transistor generally results in a superior mobility of holes, thereby increasing switching speed and drive current of P-channel transistors. Analogously, applying a tensile stress to the channel region of an N-channel transistor may likely cause an increase of the mobility of electrons in the channel region.

In silicon-based transistors, a semiconductor alloy with the same crystal structure as silicon but with a slightly greater or smaller lattice constant may be used for applying a desired amount of compressive or tensile stress in the channel region of a FET, respectively. For example, if a certain degree of compressive strain is to be applied to the channel region of a P-channel FET, a semiconductor alloy with a greater lattice constant than silicon (Si) may be used, such as a silicon/germanium (SiGe) alloy with a variable concentration of germanium (Ge). Symmetrically, a semiconductor alloy with a slightly smaller lattice constant than Si, such as silicon/carbon (SiC), may be used for applying a desired degree of tensile stress to the channel region of an N-channel FET.

In order to induce the desired level of stress in the transistor channel region, the appropriate semiconductor alloy is embedded in the active region at the ends of the channel region. For example, after forming the gate electrode, cavities may be formed in the active region, adjacent to the gate electrode structure and on opposite sides thereof. The cavities thus formed may then be filled with a layer of the semiconductor alloy, by epitaxially depositing the semiconductor alloy into the cavity. When epitaxially grown on the silicon material, the semiconductor alloy generally experiences an internal compressive or tensile strain, depending on the lattice mismatch with silicon. This strain may then induce a corresponding compressive or tensile strain component in the adjacent channel region. Consequently, a plurality of process strategies have been developed in the past in order to incorporate a highly strained semiconductor alloy material in the drain and source areas of a transistor. A semiconductor alloy layer, for example an SiGe alloy or an SiC alloy, used in the manner described above will be hereinafter referred to as an "embedded semiconductor alloy."

Embedding a semiconductor alloy in the source/drain region of a FET usually entails drawbacks and inconveniences, mainly due to the epitaxial growth process of the semiconductor alloy layer in the cavity formed in the active region.

FIG. 1a shows a cross-section of a semiconductor structure 100 formed according to the method known from the prior art. The semiconductor structure 100 includes a first active region 110a formed in a semiconductor layer 110, which may be comprised of crystalline silicon or of any other appropriate semiconductor material, such as germanium, gallium arsenide, indium arsenide, any other III-V semiconductor or the like.

A second active region 110b has been formed in the semiconductor layer 110. The second active region 110b is separated from the first active region 110a by an isolation region 140. The isolation region 140 is comprised of a dielectric material. For example, the material making up the isolation region 140 may comprise silicon dioxide (SiO$_2$).

The isolation region 140 may be, for example, formed as a shallow trench isolation (STI). Typically, the isolation region 140 is obtained by forming a trench in the semiconductor layer 110, which is subsequently filled with the desired dielectric material. The trench is formed by using an etching process. The etching process is normally carried out in the presence of a patterned mask, which leaves exposed the surface portions of the semiconductor layer 110 to be etched and screens all other surface portions from the etching. The mask is first deposited as a continuum layer on the surface of the semiconductor structure and then patterned, typically by means of optical lithography.

The semiconductor structure 100 includes a transistor 150 formed partly in and partly on top of the first active region 110a. A second transistor, not shown in FIG. 1a, might be formed partly in and partly on top of the second active region 110b.

The transistor 150 includes a gate structure 160 formed on the surface of the active region 110a. The gate structure 160 may have been formed according to the HKMG technology, or may be a traditional poly/SiON gate. A spacer structure 163 may be conveniently formed on the sidewalls of the gate structure 160. The spacer structure 163 may protect sensitive materials included in the gate structure 160. Furthermore, the spacer structure 163 may be conveniently used as a mask during implantation or etching processes performed in the course of the device manufacturing flow after gate formation.

As shown in FIG. 1a, two cavities are formed in the first active region 110a on opposite sides of the gate structure 160. More specifically, a first cavity has been formed on the left-hand side of the gate 160 and a second cavity has been formed on the right-hand side of the gate 160. The second cavity is partially defined by a surface of the isolation region 140 exposing dielectric material.

The first and the second cavities of the first active region 110a are filled with a first and a second embedded semiconductor alloy layer 122a and 124a, respectively. The semiconductor alloy layers 122a and 124a have been epitaxially formed in the first and second cavity, respectively. The semiconductor alloy of layers 122a and 124a is preferably the same. For example, layers 122a and 124a may comprise an SiGe alloy if the transistor 150 is a P-channel FET. Alternatively, layers 122a and 124a may comprise an SiC alloy if the transistor 150 is an N-channel FET.

As shown in FIG. 1a, the embedded semiconductor alloy layer 124a grown in the second cavity exposes a non-flat, tilted surface to the outside. This is due to the fact that the growth rate of the semiconductor alloy layer 124a is different at different points of the second cavity. More specifically, the semiconductor alloy layer 124a grows faster in correspondence to portions of the second cavity exposing the semiconductor material of the semiconductor layer 110. The exposed semiconductor material acts as a seed for the epitaxial growth of the semiconductor alloy. On the other hand, the epitaxial growth of the semiconductor alloy on the portions of the surface exposing the dielectric material of the isolation region 140 is seriously hindered. This causes an extremely uneven growth of the semiconductor layer 124a in the second cavity, resulting in a curved upper surface. This problem is known as the "ski slope" defect.

In order to get around the ski slope problem, a manufacturing strategy called "tucking" has been developed. The idea behind the tucking strategy is shown in FIGS. 1a-1c.

FIG. 1a shows that the semiconductor structure 100 comprises a second gate structure 160d, besides the first gate 160 formed on the surface of the first active area 110a. The second gate 160d will be hereinafter referred to as a "dummy gate." The dummy gate 160d may conveniently have been formed during the same manufacturing stage used for forming the gate 160. Thus, the dummy gate 160d has an analogous structure to the gate 160 and typically comprises analogous or the same materials as the gate 160. For example, the dummy gate 160d also has a spacer structure 163d formed on its sidewalls, analogously to the gate 163.

The dummy gate 160d extends partly on the surface of the isolation region 140 and partly on the surface of the second active region 110b. More specifically, a portion of the gate 160d, or of the spacer structure 163d, is formed onto a surface portion of the second active region 110b lying in proximity to the interface with the isolation region 140. A portion 112 of the second active region 110b is thus screened by, or "tucked," under the dummy gate 160d.

The semiconductor structure 100 also includes a further embedded semiconductor alloy layer 122b epitaxially grown in a cavity formed in the second active region 110b. The semiconductor alloy constituting layer 122b might be the same as that constituting layers 122a and 124a or a different semiconductor alloy.

The cavities hosting the semiconductor alloy layers 122a, 124a and 122b shown in FIG. 1a are preferably formed in the course of the same etching process, which is carried out after forming the gate structures 160 and 160d. Thus, the tucked semiconductor material in portion 112 of the second active region 110b is unaffected by the etching process, since it is screened by the dummy gate 160d. Consequently, the cavity formed by the etching process in the second active region 110b and to be filled with the semiconductor alloy 122b is defined by a surface exclusively exposing the semiconductor material of the active region 110b.

FIGS. 1b and 1c are top views of the same portion of the semiconductor structure 100 during consecutive stages of the manufacturing flow leading to the configuration shown in FIG. 1a.

FIG. 1b shows the semiconductor structure 100 after the isolation region 140 has been formed in the semiconductor substrate 110. We assume that the surfaces of the semiconductor layer 110 and of the isolation region 140 define a common plane, identified as the horizontal xy-plane. The isolation region 140 is adjacent to the active region 110b, so that the isolation region 140 and the active region 110b share an interface 142 defined by the boundary surface between the two areas. According to the state of the art, the interface 142 is flat, so that it defines a vertical plane substantially perpendicular to the horizontal xy-plane.

FIG. 1c shows the portion of the semiconductor structure 100 during a subsequent manufacturing stage to that shown in FIG. 1b. A gate structure 160d has been formed on the surface of the semiconductor layer 110. The gate structure 160d could, for example, be the dummy gate 160d shown in FIG. 1a. The gate 160d shown in FIG. 1c has a longitudinal axis parallel to the direction identified by the intersection of the interface 142 with the horizontal xy-plane. This direction is parallel to the y-axis in the figure. The gate structure 160d is partly formed on the surface of the isolation region 140. Furthermore, a portion of the gate 160d in proximity to its right-hand edge is formed on the active region, so that the semiconductor region 112 indicated with a dotted line is tucked under the gate 160d.

An etching process is then carried out in order to form a cavity 132b in the active region 110b. As the tucked semiconductor portion 112 is screened by the gate structure 160d, this is not etched away by the etching process. Consequently, the surface defining cavity 132*b* only exposes the semiconductor material making up the active region, and not the dielectric material of the isolation region. When the cavity 132*b* is filled with an embedded semiconductor alloy 122*b*, the system looks as shown in FIG. 1*a*.

FIGS. 1*a*-1*c* show examples of single-sided tucking, which does not entail significant technical challenges. However, the manufacturing process is extremely critical when double-sided tucking is to be achieved, i.e., using the same gate structure for simultaneously tucking respective portions of two neighboring active areas.

Some of the problems encountered when trying to achieve double-sided tucking are schematically illustrated in FIG. 1*d*, wherein the semiconductor structure 100 includes two neighboring active areas (not shown) formed on opposite sides of the isolation region 140. The gate structure 160 has been formed so as to simultaneously lie on the surface of the isolation region 140 and of the two active regions, so that the gate 160 tucks a portion 114 of the first active region and a portion 112 of the second active region. An etching process results in the formation of a cavity 134*a* in the first active region and a cavity 132*b* in the second active region.

In order for the gate structure 160 to be able to tuck a semiconductor layer portion included in both active regions, the distance between the active regions must be small enough. This requirement results in an upper bound on the thickness of the isolation region 140, i.e., on the distance between the interfaces 142 and 146 formed by the isolation region 140 with the first and the second active regions, respectively.

As the gate length shrinks, the thickness of the isolation region 140 is required to decrease accordingly. For example, considering that typical gate lengths may be as small as about 20 nm in the currently most advanced semiconductor manufacturing technologies, the thickness of the isolation region 140 should ideally be of a few nanometers and may by no means exceed an upper bound of about 10 nm. However, by making the isolation region 140 thinner and thinner, other problems arise, due, for example, to the limited precision of the optical lithography techniques used when forming the isolation region 140.

A likely effect of excessively shrinking the thickness of the isolation region 140 is shown in FIG. 1*d*, with the formation of an overlapping or bridging area 116 connecting the first and the second active regions. The bridging areas 116 arise since the thickness of the isolation region 140 is too small to be able to be resolved by optical lithography. Bridging areas 116 are extremely undesirable, since they act as electrical short circuits between neighboring active areas, thereby likely leading to device failure.

A need then exists for an improved transistor manufacturing technique enabling double-sided tucking in transistors requiring a semiconductor alloy embedded in the source/drain regions. Specifically, the trend of semiconductor manufacturing technologies towards a progressive reduction of the transistor gate length calls for an improvement in the tucking strategies known from the prior art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the new and inventive idea that a transistor design can be improved if the isolation region delimiting an active region is formed so as to define an interface with the active region which is not planar. More specifically, the present disclosure relies on the innovative finding that a transistor design and a transistor manufacturing process can be improved if the interface between the isolation region and an active region comprises an indentation defining a portion of the active region protruding into the isolation region. Based on this idea, the semiconductor structure claimed in independent claim 1 is hereby proposed. The semiconductor structure comprises a semiconductor layer comprising a semiconductor material, at least one active region formed in the semiconductor layer, and an isolation region forming an interface with the active region, the isolation region comprising a dielectric material, the interface comprising at least one indentation, wherein the indentation delimits an extending portion of the active region projecting into the isolation region.

In this manner, a gate structure may be formed on the surface of the semiconductor so as to at least partially cover the extending portion of the active region. An etching process may subsequently be carried out in order to form a cavity in the active region. Due to the screening action of the gate structure, at least a portion of the extending portion is not etched away and the cavity exposes the semiconductor material of the semiconductor layer in correspondence to the position of the indentation and of the extending region. This favors epitaxial growth of a semiconductor alloy which can be subsequently deposited into the cavity.

A method of forming a semiconductor structure is also provided including providing a semiconductor layer comprising a semiconductor material, forming an isolation region comprising a dielectric material in the semiconductor layer and forming at least one active region in the semiconductor layer, the at least one active region forming an interface with the isolation region, the interface defining at least one laterally extending indentation, wherein the indentation delimits an extending portion of the active region projecting into the isolation region.

BRIEF DESCRIPTION OF THE DRAWINGS

The disclosure may be understood by reference to the following description taken in conjunction with the accompanying drawings, in which like reference numerals identify like elements, and in which.

Figure 1A:
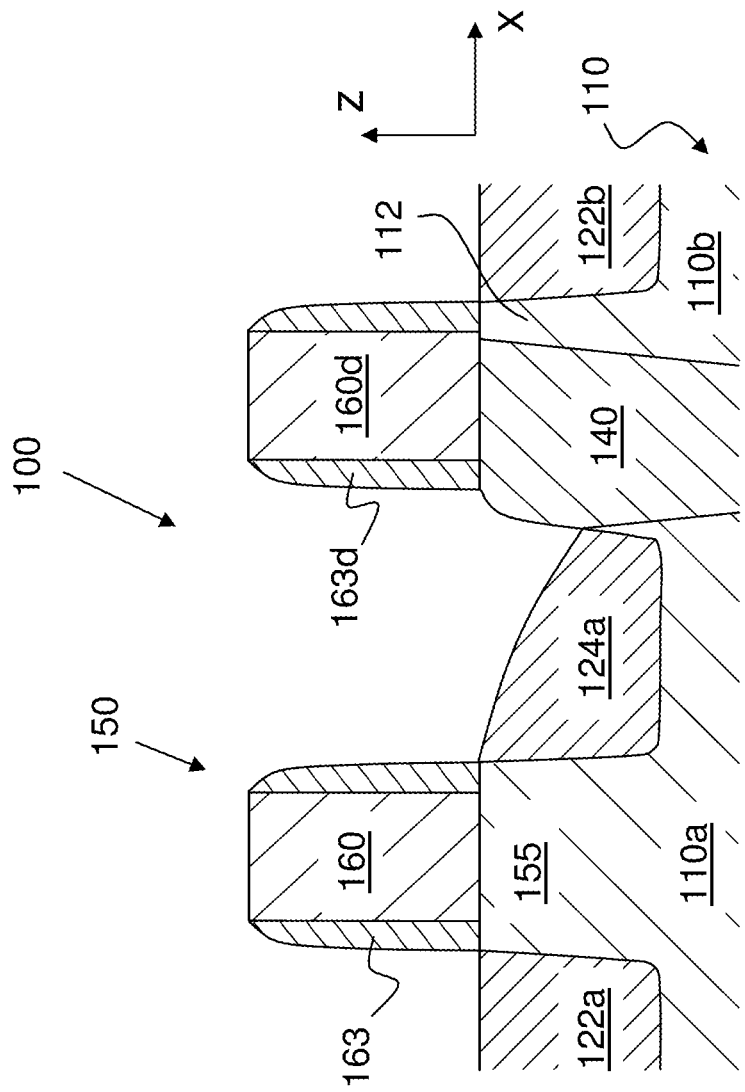
FIG. 1*a* schematically illustrates a cross-sectional view of a semiconductor structure comprising a transistor known from the prior art.
Figure 1B:
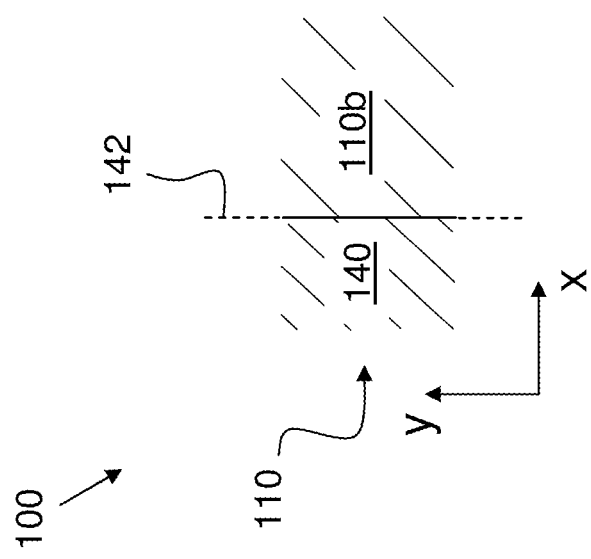
FIGS. 1*b* and 1*c* schematically illustrate top views of a semiconductor structure during subsequent stages of a manufacturing process flow according to the prior art.
Figure 1C:
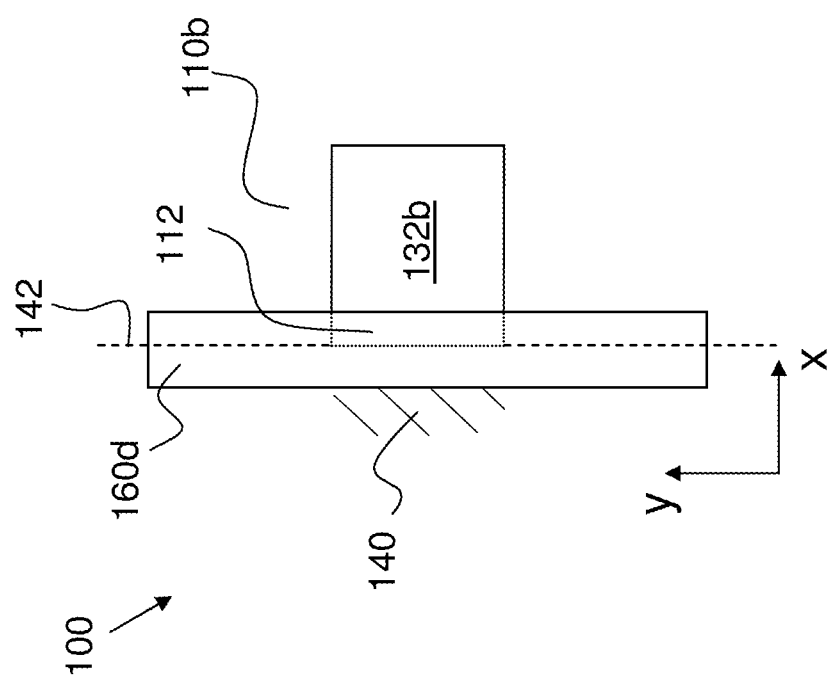
Figure 1D:
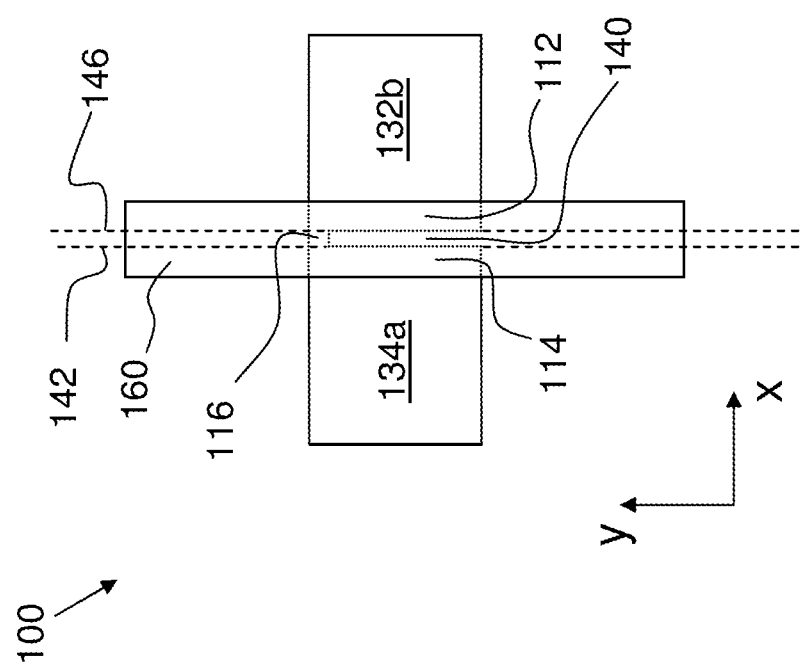
FIG. 1 *d* schematically illustrates a top view of a semiconductor structure known from the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be noted that, where appropriate, the reference numbers used in describing the various elements illustrated in FIGS. 2a-2f substantially correspond to the reference numbers used in describing the corresponding elements illustrated in FIGS. 1a-1d above, except that the leading numeral for corresponding features has been changed from a "1" to a "2". For example, semiconductor structure "100" corresponds to semiconductor structure "200," gate electrode "160d" corresponds to gate electrode "260d," isolation region "140" corresponds to isolation region "240" and so on. Accordingly, the reference number designations used to identify some elements of the presently disclosed subject matter may be illustrated in FIGS. 2a-2f but may not be specifically described in the following disclosure. In those instances, it should be understood that the numbered elements shown in FIGS. 2a-2f which are not described in detail below substantially correspond with their like-numbered counterparts illustrated in FIGS. 1a-1d, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2f, it should be understood that the gate electrode structure 260 is formed "above" the active region 210a and that the active region 210a is formed "adjacent to" the isolation region 240.

FIGS. 2a-2d show top views of a semiconductor structure during subsequent stages of a manufacturing process flow according to an embodiment of the present invention. Throughout the description, the xy-plane will be identified as the reference horizontal plane and the direction of the z-axis will be referred to as the vertical direction.

Figure 2A:
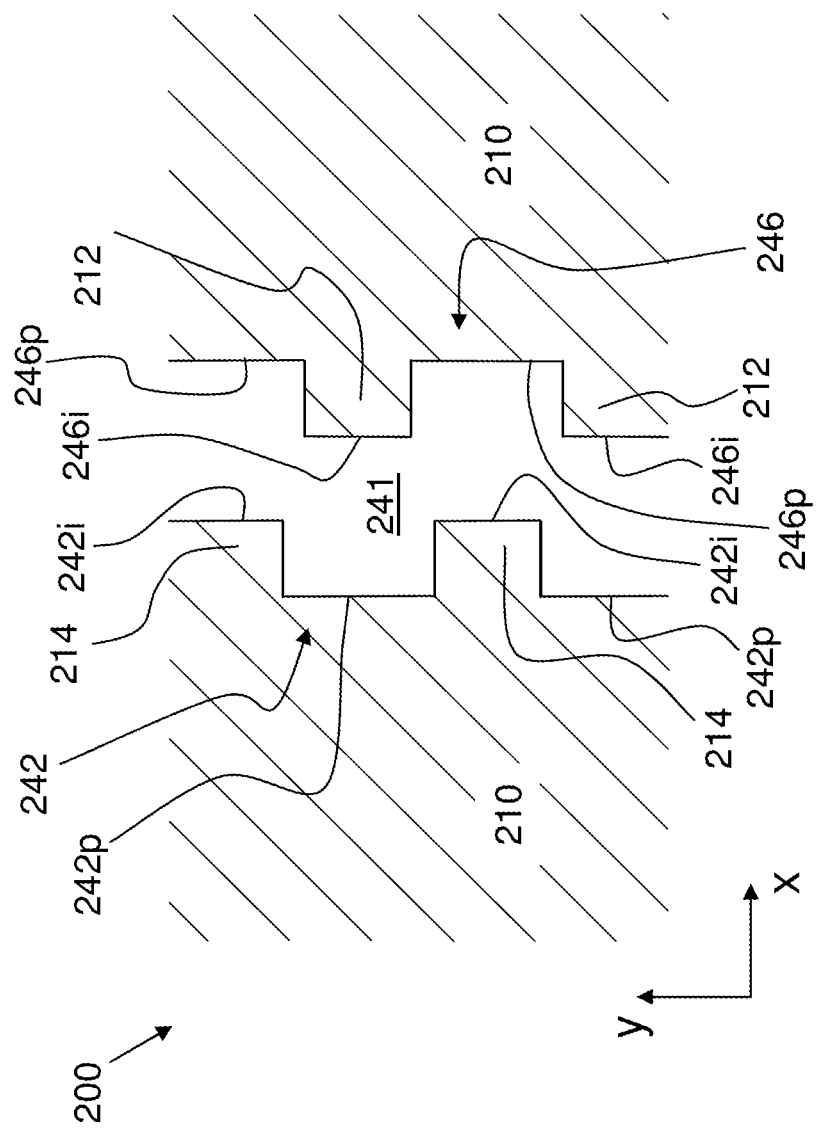
FIGS. 2*a*-2*d* show top views of a semiconductor structure during subsequent manufacturing stages of a manufacturing process flow according to an embodiment of the present invention.

FIG. 2a shows a top view of a semiconductor structure 200 comprising a semiconductor layer 210. The semiconductor layer 210 exposes a surface substantially coincident with the horizontal xy-plane. Although not shown in the figures, it should be understood that the semiconductor layer 210 may be supported by a substrate provided by any suitable carrier. The semiconductor structure 200, the substrate and the semiconductor layer 210 may form a silicon-on-oxide (SOI) configuration or a bulk configuration, depending on the overall process and device requirements.

According to some embodiments, the semiconductor layer 210 comprises silicon. According to particular embodiments, the semiconductor layer 210 comprises mono-crystalline silicon. According to further embodiments, the semiconductor layer 210 comprises a semiconductor such as germanium or a III-V semiconductor.

A trench 241 has been formed in the semiconductor layer 210, which is to form a housing for an isolation region separating neighboring active regions. In typical implementations, the trench 241 is defined by surfaces whose shape does not depend on the vertical z-coordinate. Thus, all cross-sections of the trench 241 across a horizontal plane parallel to the reference xy-plane look the same.

As shown in FIG. 2a, the trench 241 has a width which is much greater than its length. Thus, the cross-section of the trench 241 across horizontal plane xy mainly extends along the y-axis. By the term "width," it should be understood the dimension of an element along the y-axis. On the other hand, the term "length" usually indicates the dimension of an element along the x-axis. Finally, the term "height" is used to refer to the dimension of an element along the vertical z-axis.

The trench 241 may have been defined by uniformly depositing a mask, such as a photoresist, on the surface of the semiconductor layer 210. The mask may then be patterned, for example, by using optical photolithography. An etching process may subsequently be carried out in the presence of the patterned mask so as to form the trench 241. The mask may then be removed after performing the etching process.

The trench 241 is laterally defined by a first boundary surface 242, identifying the left-hand boundary between the trench 241 and the semiconductor layer 210. In typical implementations, the profile of the first boundary surface 242 does not depend on the vertical z-coordinate.

Unlike the method according to the prior art, the first boundary surface 242 is not planar. More specifically, the first boundary surface 242 comprises at least one laterally extending indentation 242i defining a bulge 214 projecting into the cavity 241. The bulge 214 protrudes outwards from a vertical plane parallel to the yz-plane, across which first boundary surface substantially extends. The bulge 214, which will also be referred to as extending portion of the semiconductor layer 210, is comprised of the semiconductor material of the semiconductor layer 210. In the embodiment shown in FIG. 1a, first boundary surface 242 comprises two indentations 242i defining two respective bulges 214.

The first boundary surface 242 further comprises laterally extending protrusion 242p adjacent and contiguous to at least one of the bulges 214 and the indentations 242i. In correspondence to protrusions 242p, the trench 241 projects into the semiconductor layer 210. In the embodiment shown in FIG. 2a, the first boundary surface 242 comprises two protrusions 242p. A protrusion 242p may be formed between two indentations 242i located at opposites edges of the protrusion 242p. In this case, the two indentations 242i laterally delimit the protrusion 242p, such as in the case of the upper protrusion 242p shown in FIG. 2a. Symmetrically, an indentation 242i may be formed between two protrusions 242p located at opposite sides of the indentation 242i. This is, for example, the case of the lower indentation 242i shown in FIG. 2a, which is therefore laterally delimited by the two protrusions 242p.

Preferably, the number of indentations 242i is equal to the number of protrusions 242p. The number of indentations 242i and/or protrusions 242p does not have to be necessarily two, but can be any natural number greater than zero.

In some embodiments, the first boundary surface 242 is obtained as a regular repetition of a pattern. Preferably, the repetition is periodic. The pattern is comprised of an indentation 242i contiguous to a protrusion 242p. Thus, the first boundary surface 242 may be formed as a periodic alternation of indentations 242i and protrusions 242p. The number of repetitions of the pattern may be any suitable number greater than or equal to one.

Given the profile of the first boundary surface 242 intercepted by a horizontal plane shown in FIG. 2a, the length of the boundary surface 242 may be defined as the distance between the leftmost and the rightmost point of the intercepted profile. As seen in FIG. 2a, this length is much less than the width of the first boundary surface, i.e., of the dimension of the first boundary surface 242 along the y-axis. It can, therefore, be said that the profile of the first boundary surface 242 intercepted by a horizontal plane mainly extends along the y-axis.

In some embodiments, all indentations 242i have the same width. In some embodiments, the indentations 242i have a width in the range of about 10-90 nm. For the 28-nm-technology, the width of the indentations 242i is preferably in the range of about 50-80 nm. For fabrication technologies beyond the 28-nm-technology, the width of the indentations 242i may be less than 50 nm. It should be observed that the width of a portion of the first boundary surface 242 may also be defined as the dimension along a parallel direction to the axis along which the profile of the first boundary surface 242 intercepted by a horizontal plane extends.

In some embodiments, all protrusions 242p have the same width. The protrusions 242p may have a width in the range of about 10-100 nm. Preferably, the protrusions 242p have a width in the range of approximately 10-40 nm. In some embodiments, the width of the indentations 242i is less than the width of the protrusions 242p. In particular embodiments, the ratio of the width of the indentations 242i to the width of the protrusions 242p is in the range of 1:4 to 1:1 and, preferably, of 1:4 to about 1:1.5.

The trench 241 is also defined by a second boundary surface 246, identifying the right-hand boundary between the trench 241 and the semiconductor layer 210. It should be understood that all features and embodiments described in relation to the first boundary surface 242 may be applied, unless otherwise stated, to the second boundary surface 246.

In particular, the second boundary surface 246 is not planar and includes indentations 246i alternated to protrusions 246p. Symmetrically to the first boundary surface 242, each indentation 246i of the second boundary surface 246 defines a respective bulge 212 projecting into the trench 241. Analogously, each protrusion 246p defines a respective portion of the trench 241 projecting into the semiconductor layer 210. Preferably, the width of the indentations 246i of the second boundary surface 246 is the same as the width of the indentations 242i of the first boundary surface 242. Furthermore, the width of the protrusions 246p of the secondary boundary surface 246 is preferably the same as the width of the protrusions 242p of the first boundary surface 242.

According to the preferred embodiment shown in FIG. 2a, the profile of the second boundary surface 246 is correlated to the profile of the first boundary surface 242. The profiles of the first and second boundary surfaces 242 and 246 are correlated in such a way that an indentation 246i of the second boundary surface 246 faces a protrusion 242p of the first boundary surface 242. Symmetrically, an indentation 242i of the first boundary surface 242 faces a protrusion 246p of the second boundary surface 246. Thus, the pattern produced by the correlation between the profiles of the first and second boundary surfaces 242 and 246 is reminiscent of the manner how protruding metal pins interact with interstitial void spaces in a zipper.

Here, two points are said to "face" each other when they have the same y-coordinate. By stating, for example, that an indentation 246i of the second boundary surface 246 (an indentation 242i of the first boundary surface 242) "faces" a protrusion 242p of the first boundary surface 242 (a protrusion 246p of the second boundary surface 246), it will be understood that, given a point of indentation 246i (indentation 242i) having a y-coordinate $y_P$, a point of the first boundary surface 242 (second boundary surface 246) having the same y-coordinate $y_P$ is included in a protrusion 242p (protrusion 246p).

In the embodiment shown in FIG. 2a, the intersections of the first and second boundary surfaces 242 and 246 with the horizontal xy-plane form broken lines including indentations 242i, 246i and protrusion 242p, 246p which define substantially rectangular shapes. However, in other embodiments not shown in the figures, indentations 242i, 246i and protrusions 242p, 246p may define shapes different from a rectangle, such as, for example, a trapezoid, a parallelogram, etc. According to further embodiments not shown in the figures, the intersections of the first and second boundary surfaces 242 and 246 with the horizontal xy-plane form smooth, curved lines. For example, the curved line could be a sinusoid. Alternatively, the intersection between indentations 242i, 246i and/or protrusions 242p, 246p with a horizontal plane could comprise an arc of a curve, such as a circle, a hyperbole, a parabola and the like.

In general, indentations and protrusions included in the same boundary surface have opposite curvatures with respect to each other. Thus, indentations 242i of the first boundary surface 242 (indentations 246i of the second boundary surface 246) have an opposite curvature with respect to protrusions 242p of the first boundary surface 242 (protrusions 246p of the second boundary surface 246). Furthermore, it should be noticed that the sign of the curvature of indentations 242i of the first boundary surface 242 is the opposite of the sign of the curvature of indentations 246i of the second boundary surface 246.

Figure 2B:
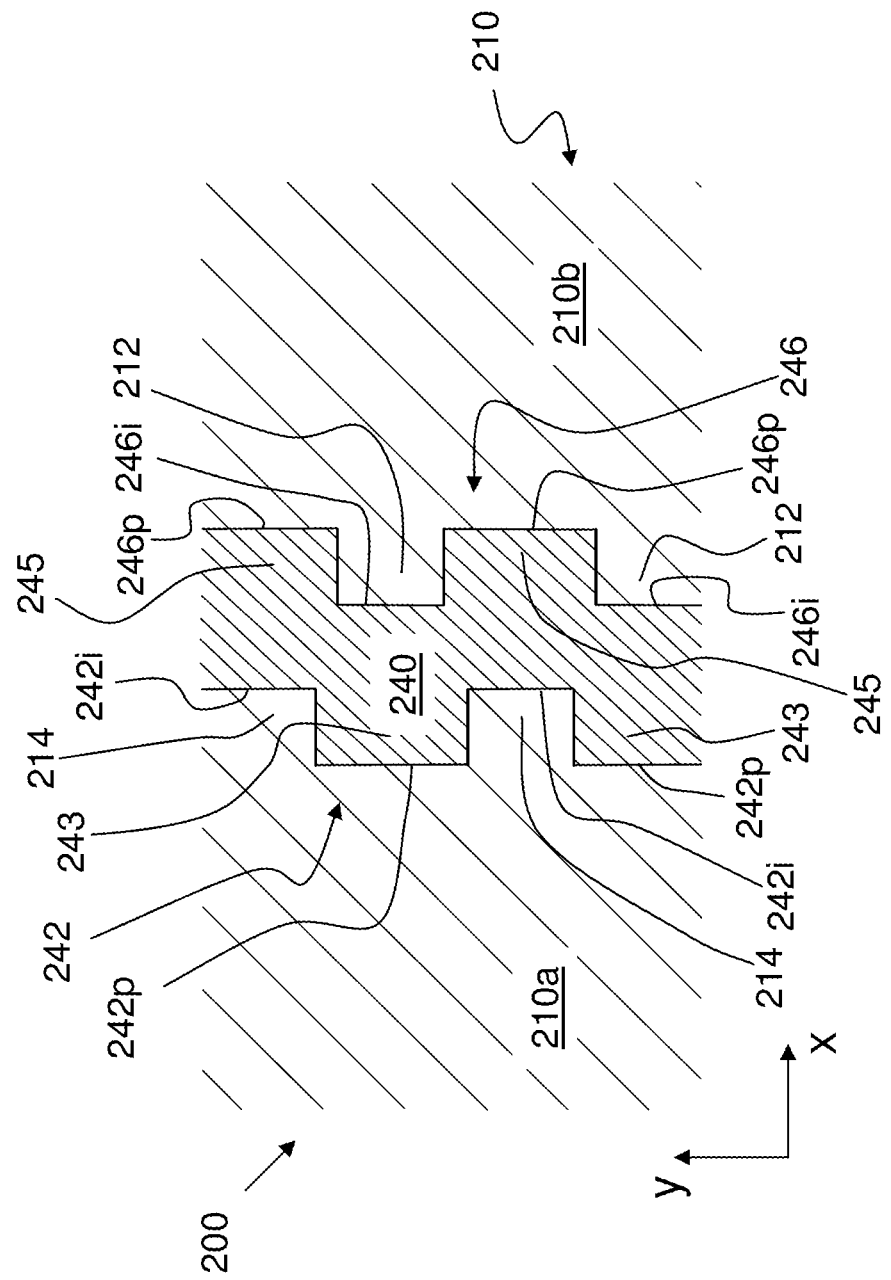

After being formed as discussed above, the trench 241 is filled with a dielectric material so as to give rise to an isolation region 240, as shown in FIG. 2b. The dielectric material may, for example, comprise an oxide. If the semiconductor layer 210 comprises silicon, the dielectric material making up the isolation region 240 may conveniently comprise silicon dioxide ($SiO_2$).

Still with reference to FIG. 2b, after forming the isolation region 240, a first active region 210a and a second active region 210b may be formed on opposite sides of the isolation region 240. The isolation region 240 divides the first active region 210a from the second active region 210b. Defining active regions 210a and 210b may comprise performing a series of implantations, for instance a series of well implantations, so as to form a well structure in active regions 210a and 210b having a predefined doping profile.

As shown in FIG. 2b, protrusions 242p of the first boundary surface 242 define first protruding portions 243 of the isolation region 240. The first protruding portions 243 project into the active region 210a. Symmetrically, protrusions 246p of the second boundary surface 246 define second protruding portions 245 of the isolation region 240. The second protruding portions 245 project into the active region 210b.

Figure 2C:
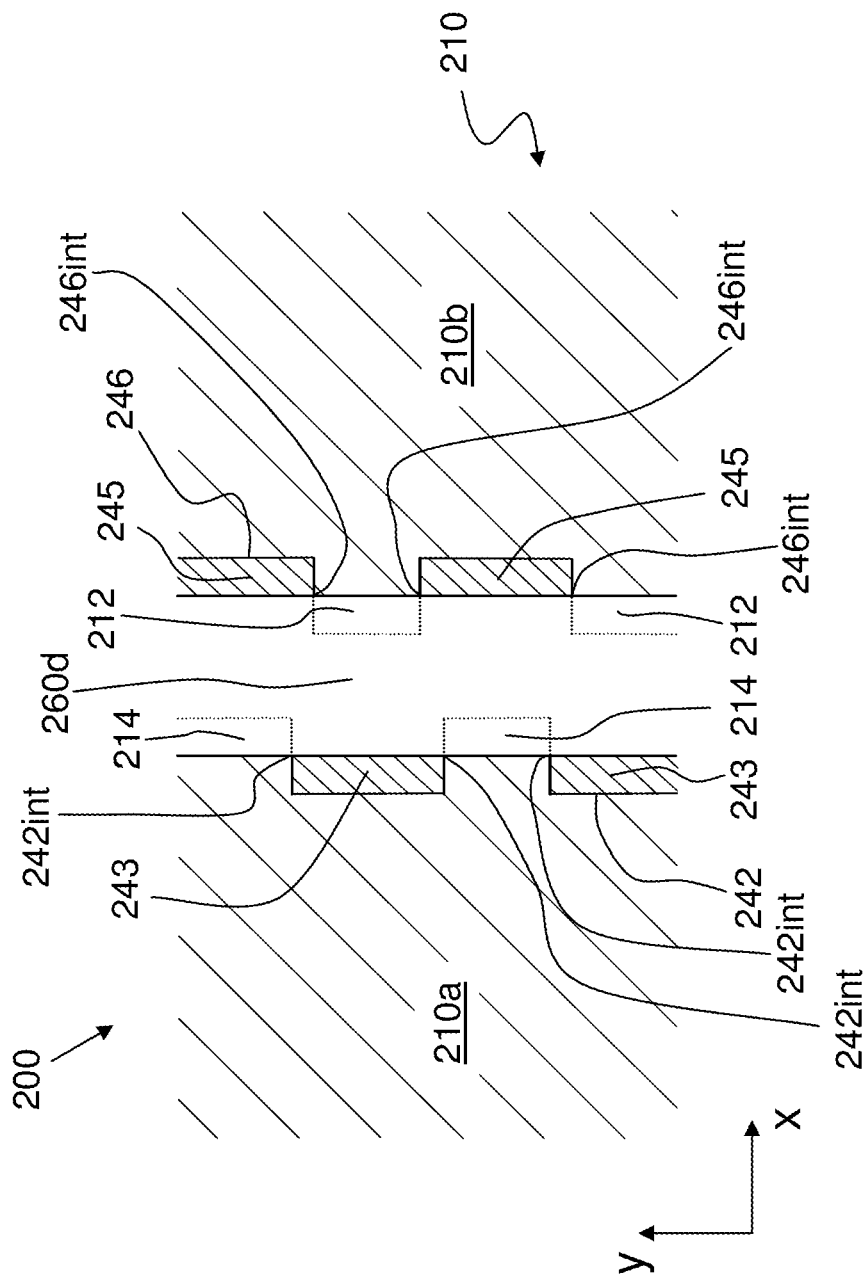

FIG. 2c shows that, after forming the isolation region 240 and active regions 210a and 210b, a gate structure 260d is formed on the surface of the semiconductor layer 210. The gate structure 260d, which could be analogous to the dummy gate 160d shown in FIG. 1a, is formed on respective surface portions of the isolation region 240, first active region 210a and second active region 210b. The gate structure 260d could be a traditional poly/SiON gate structure or could be formed according to the HKMG technology, depending on the device requirements.

With reference to FIG. 2c, the gate 260d is formed so as to have a left-hand edge and a right-hand edge, both parallel to the y-axis. Furthermore, the left-hand edge of the gate structure 260d is positioned so as to intersect the surface portion of the first boundary surface 242 in at least one point. Preferably, the intersection point lies at a distance greater than zero from the rightmost point of the first boundary surface 242. The rightmost point of the first boundary surface 242 is the closest point to the second active area 210b. In FIG. 2c, the left-hand edge of the gate structure 260d intersects the surface portion of the first boundary surface 242 in three points 242int.

The left-hand edge of the gate structure 260d comprises portions formed on the semiconductor material of the active region 210a alternated to portions formed on the dielectric material of the isolation region 240. More specifically, the left-hand edge is formed on the semiconductor material in correspondence to extending portions 214 of the active region 210a. Furthermore, the left-hand edge is formed on the dielectric material in correspondence to the first protruding portions 243 of the isolation region 240. Intersection points 242int delimit the segments of the left-hand edge of the gate 260d lying on the active region 110a and on the isolation region 240.

Thus, the gate structure 260d is positioned so as to cover, at least partially, the surface portion of bulges or extending portions 214 of the active region 210a. The extending portions 214 are, therefore, tucked under the gate structure 260d. The first protruding portions 243 of the isolation region 240 can instead be left exposed, entirely or partially, by the gate structure 260d.

An analogous discussion as set forth above may be applied, mutatis mutandis, to the position of the right-hand edge of the gate structure 260d with respect to the second boundary surface 246. In particular, the right-hand edge of the gate structure 260d intersects the surface portion of the second boundary surface 246 in three points 246int. In this manner, the extending portions 212 of the active region 210b are tucked under the gate structure 260d. The second protruding portions 245 of the isolation region 240 can instead be left exposed by the gate 260d.

Figure 2D:
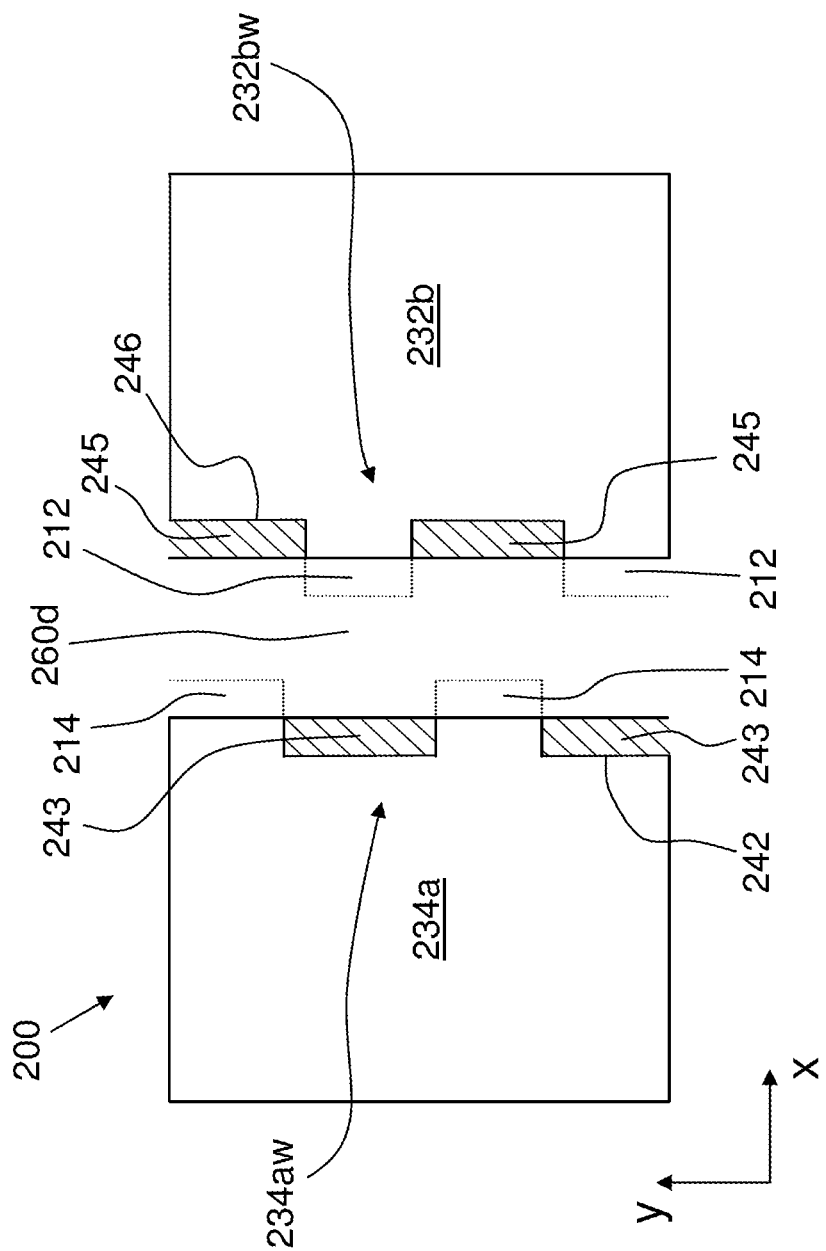

FIG. 2d shows that, after forming the gate structure 260d, an etching process is performed in order to form cavities 234a and 232b in the first active region 210a and the second active region 210b, respectively. The etching process is preferably anisotropic. For example, a plasma-based etch may be used. Alternatively, reactive ion etching (RIE) may be chosen for forming the cavities 234a and 232b. In some embodiments, the etch process is selective in such a way that the etch rate of the semiconductor material of layer 210 is much greater than the etching rate of the dielectric material of isolation region 240.

Since extending portions 214 of the active region 210a are tucked under and covered by the gate structure 260d, these portions of the active region 210a are not affected by the etch. Thus, the cavity 234a is defined on the side of the isolation region 240 by a sidewall 234aw including a portion of the first boundary surface 242. Sidewall 234aw comprises surface regions of extending portions 214 exposing the semiconductor material of the semiconductor layer 210, alternated to surface regions of the first protruding portions 243 exposing the dielectric material of the isolation region 240. Due to the selectivity of the etching process used for forming the cavities 234a and 232b, the portions of sidewall 234aw included in extending portions 214 of the active region 210a are recessed with respect to the portions included in the first protruding portions 243 of the isolation region 240.

In a symmetric manner, the cavity 232b is defined by a sidewall 232bw including a portion of the second boundary surface 246. Sidewall 232bw comprises portions exposing the semiconductor material of tucked extending portions 212 of the second active region 210b, separated by portions exposing the dielectric material of the second protruding portions 245 of the isolation region 240.

Figure 2E:
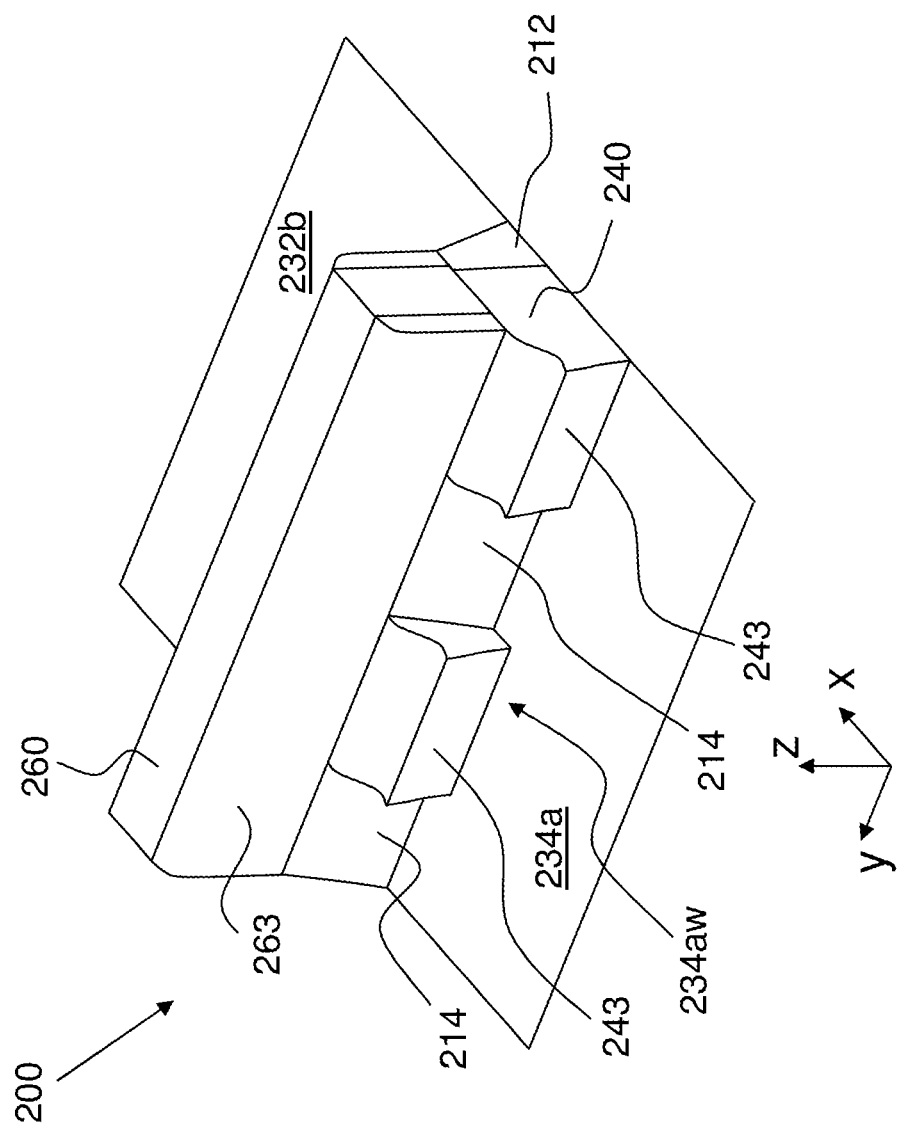
FIG. 2*e* shows a perspective view of a semiconductor structure according to an embodiment of the present invention during the same manufacturing stage as shown in FIG. 2*d*.

FIG. 2e shows a perspective view of the semiconductor structure 200 in the same manufacturing stage shown in FIG. 2d. FIG. 2e clearly illustrates the sidewall 234aw defining the cavity 234a as comprised of portions included in extending portions 214 of the active region 210a, adjacent to portions included in the first protruding portions 243 of the isolation region 240.

The cavities 234a and 232b are then filled with one or more semiconductor alloy layers. The semiconductor alloy layers embedded in the cavities 234a and 232b may be SiGe if a P-channel FET is to be formed in the first active region 210a or in the second active region 210b. Alternatively, the semiconductor alloy layer may comprise SiC, if an N-channel FET is to be formed in one of the active regions 210a or 210b.

Filling cavities 234a and 232b is achieved by epitaxially depositing the semiconductor alloy in the cavities. Epitaxial growth techniques which may be used include chemical vapor deposition (CVD), plasma-enhanced CVD, atomic layer deposition (ALD) or any other like technique known to a skilled person. During epitaxial deposition of the semiconductor alloy, the portions of the sidewalls 234aw and 232bw of the cavities 234a and 232b exposing the semiconductor extending portions 214 and 212, respectively, act as seed points for the growth of the semiconductor alloy. In this manner, tucked extending portions 214 and 212 favor a more homogeneous growth of the semiconductor alloy in cavities 234a and 232b, respectively. After depositing the semiconductor alloy layer in the cavities 234a and 232b, this forms an interface with the semiconductor material exposed by the extending portions 214 and 212.

Figure 2F:
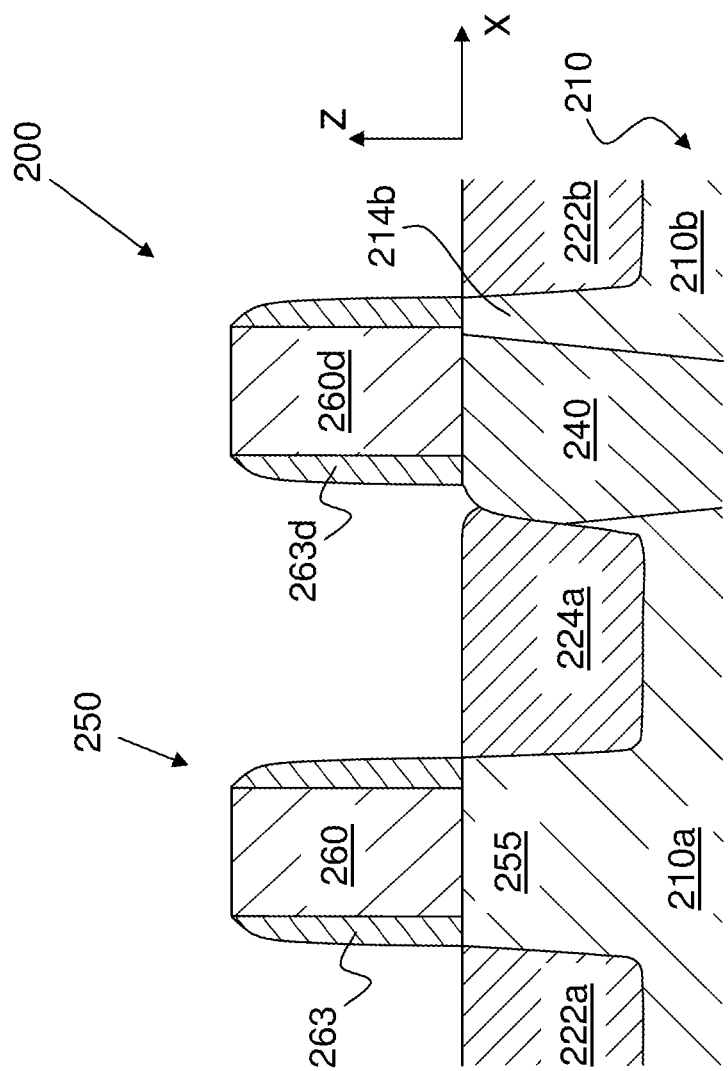
FIG. 2*f* shows a cross-sectional view of a semiconductor structure comprising a transistor according to an embodiment of the present invention during an advanced manufacturing stage.

FIG. 2*f* shows a cross-section of the semiconductor structure 200 in an advanced manufacturing stage substantially analogous to that shown in FIG. 1*a*. A transistor 250, which could be an N-channel FET or a P-channel FET, has been formed partly in and partly on the first active region 210*a*. The transistor 250 comprises a gate 260 formed on the surface of the first active region 210*a*. The gate 260, which could be a traditional poly/SiON gate or a high-k/metal gate, may have been formed during the same manufacturing step used for forming the gate 260*d*.

Cavities 234*a* and 232*b* are then formed as described above with reference to FIGS. 2*d* and 2*e*. Preferably, the cavities 234*a* and 232*b* are formed in the first active region 210*a* and in the second active region 210*b*, respectively, after forming the gate structures 260 and 260*d* shown in FIG. 2*f*. Furthermore, an additional cavity may be formed in the active region 210*a* on the left-hand side of the gate structure 260. Subsequently, the cavities 234*a* and 232*b* are epitaxially filled with semiconductor alloy layers 224*a* and 222*b*, respectively. Furthermore, the additional cavity on the left-hand side of the gate structure 260 is filled with semiconductor alloy 222*a*. Semiconductor alloy layers 224*a* and 222*b* can either be the same or different from each other.

After epitaxially forming semiconductor alloy layers 222*a*, 224*a* and 222*b*, source/drain regions (not shown) of the transistor 250 are formed in the active region 210*a*. This may comprise performing a series of ion implantations in the active region 210*a*. These implantations are preferably carried out in the presence of the semiconductor alloy layers 222*a*, 224*a*. The semiconductor alloy layer 222*b* may either be exposed or screened when performing the ion implantations aimed at forming source/drain regions of the transistor 250.

In particular, a series of implantations may be initially carried out in order to define halo regions and extension regions of the source/drain regions. During this series of halo/extension implantations, the spacer structure 263 may be conveniently used as an implantation mask. Subsequently, a second series of implantations may be performed in order to define deep regions of the source/drain regions. Conveniently, the spacer structure 263 may be broadened after the halo/extension implantations and before the implantations defining the deep regions.

It is pointed out that the implantations carried out in order to define the source and drain regions of the transistor 250 affect the semiconductor alloy layers 222*a* and 224*a*, which are preferably exposed during the implantations. Thus, the source and drain regions of the transistor 250 include, at least partially, the semiconductor alloy layers 222*a* and 224*a* embedded in the active region 210*a*.

Finally, the semiconductor structure 200 may undergo an annealing process in order to activate the implanted impurities and to permit recovery of the lattice structure of the semiconductor layer 210 after implantation damage. After the annealing process, the channel region 255 of the transistor 250 rests defined between the source region and the drain region.

As shown in FIG. 2*f*, the semiconductor alloy 224*a* exposes a flat, regular surface defining the same horizontal plane as the surface of the semiconductor layer 210. Although the cavity 234*a* is adjacent to the isolation region 240, the semiconductor alloy 224*a* has grown in a homogeneous manner inside the cavity. This has been achieved thanks to the presence of the tucked semiconductor layer portions 214 exposed towards the cavity before starting the deposition process.

After forming the source/drain regions of the transistor 250 and annealing the structure, as discussed with reference to FIG. 2*f*, the semiconductor manufacturing flow may continue in a conventional manner. For example, a silicidation process may be carried out in order to form metal silicide layers, typically nickel silicide, on the surface of the source/drain regions and of the gate structure 260 of the transistor 250. Thereafter, a dielectric layer comprising, for example, an interlayer dielectric may be formed on the surface of the semiconductor structure 200. Via openings may then be formed in the interlayer dielectric layer so as to expose portions of the surface of the semiconductor structure 200 comprising metal silicide. Via openings are then filled with an electrically high conductive metal in order to permit electrical contact with the source/drain regions and with the gate electrode of the transistor 250.

Thus, instead of tucking a full stripe of semiconductor material under the gate 260*d*, the present disclosure proposes tucking "discrete" portions of the active region 210*a* projecting into the isolation region 240. When the isolation region 240 divides two neighboring active regions, the tucked portions of the two isolation regions can conveniently be formed in a staggered arrangement with respect to each other, so as to achieve a "zippered" tucking pattern. In this manner, the length of the isolation region can be maintained at a sufficiently high value for the optical lithography to resolve all features, while at the same time permitting tucking of both active regions formed on opposite sides of the isolation region.

The claimed device and method find a particularly advantageous application in conjunction with semiconductor manufacturing technologies starting from 45 nm and beyond. In particular, the claimed method and device may be applied to the 28-nm-technology and beyond.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a semiconductor layer comprising a semiconductor material;
   at least one active region formed in said semiconductor layer; and
   an isolation region forming an interface with said active region, said isolation region comprising a dielectric material, said interface comprising at least one laterally extending indentation;
   wherein said indentation delimits an extending portion of said active region projecting into said isolation region.

2. The semiconductor device of claim 1, wherein said indentation extends by a width in the range of about 10-90 nm along a parallel direction to a direction along which a profile of said interface extends, said profile being intercepted by a plane parallel to the surface of said semiconductor layer.

3. The semiconductor device of claim 1, wherein said isolation region comprises a protruding portion projecting into said active region.

4. The semiconductor device of claim 3, wherein said protruding portion extends by width in the range of about 10-100 nm along a parallel direction to a direction along which a profile of said interface extends, said profile being intercepted by a plane parallel to the surface of said semiconductor layer.

5. The semiconductor device of claim 3, wherein the ratio of the width of said indentation to the width of said protruding portion is in the range of about 1:4 to about 1:1, or of about 1:4 to about 1:1.5.

6. The semiconductor device of claim 1, further comprising a cavity formed in said active region adjacent to said isolation region, said cavity being defined by a sidewall comprising a portion included in said extending portion of said active region, said portion of said sidewall exposing said semiconductor material of said semiconductor layer.

7. The semiconductor device of claim 6, wherein said isolation region comprises a protruding portion projecting into said active region and wherein said sidewall comprises a surface portion of said protruding portion.

8. The semiconductor device of claim 6, wherein said cavity is filled with an epitaxially-formed semiconductor alloy.

9. The semiconductor device of claim 8, wherein said semiconductor alloy forms an interface with said semiconductor material exposed by said portion included in said extending portion.

10. The semiconductor device of claim 1, wherein said at least one active region comprises a first active region and a second active region formed on opposite sides of said isolation region, said first active region forming a first interface with said isolation region, said second active region forming a second interface with said isolation region, each of said first and said second interface defining said at least one laterally extending indentation, respectively.

11. The semiconductor device of claim 10, wherein the profile of said first interface is correlated to the profile of said second interface in such a way that said indentation of said first interface faces a non-indented portion of said second interface and said indentation of said second interface faces a non-indented portion of said first interface.

12. The semiconductor device of claim 1, further comprising a gate structure formed on the surface of said semiconductor layer so as to cover a surface area of said extending portion of said active region.

13. The semiconductor device of claim 1, further comprising:
  a gate structure formed on the surface of said semiconductor layer so as to cover a surface area of said extending portion of said active region; and
  a transistor comprising a source/drain region including a semiconductor alloy embedded in a cavity formed in said active region, said semiconductor alloy forming an interface with said extending portion of said active region.

14. A method of manufacturing a semiconductor device, comprising:
  providing a semiconductor layer comprising a semiconductor material;
  forming an isolation region comprising a dielectric material in said semiconductor layer; and
  forming at least one active region in said semiconductor layer, said at least one active region forming an interface with said isolation region, said interface defining at least one laterally extending indentation;
  wherein said indentation delimits an extending portion of said active region projecting into said isolation region.

15. The method of claim 14, wherein said step of forming said isolation region comprises:
  forming a trench in said semiconductor layer, said trench being defined by a boundary surface comprising a bulging portion protruding from said semiconductor layer into said trench, said boundary surface comprising said interface between said isolation region and said active region; and
  filling said trench with said dielectric material so that said bulging portion of said boundary surface comprises said indentation of said interface.

16. The method of claim 14, wherein said step of forming said at least one active region comprises:
  forming a first active region on a first side of said isolation region, said first active region forming a first interface with said isolation region defining at least a first indentation; and
  forming a second active region on a second side of said isolation region opposite said first side, said second active region forming a second interface with said isolation region defining at least a second indentation.

17. The method of claim 16, wherein the profiles of said first interface and said second interface are correlated, so that said first indentation of said first interface faces a non-indented portion of said second interface and said second indentation of said second interface faces a non-indented portion of said first interface.

18. The method of claim 14, further comprising forming a gate structure on the surface of said semiconductor layer so that said gate structure at least partially covers said extending portion of said active region, said gate structure being formed after forming said at least one active region and said isolation region.

19. The method of claim 14, further comprising forming at least one cavity in said active region adjacent to said isolation region in such a way that said cavity is defined by a sidewall comprising a portion included in said extending portion of said active region, said portion of said sidewall exposing said semiconductor material of said semiconductor layer.

20. The method of claim 19, further comprising forming a semiconductor alloy layer so as to fill said cavity.

21. The method of claim 20, wherein said semiconductor alloy is formed in said cavity by means of epitaxial growth.

22. The method of claim 14, further comprising:
  forming a gate structure on the surface of said semiconductor layer so as to at least partially cover said extending portion of said active region;
  forming at least one cavity in said active region adjacent to said isolation region in such a way that said cavity is defined by a sidewall comprising at least a surface area of said extending portion of said active region;
  filling said cavity with a semiconductor alloy; and
  forming a transistor partly in and partly on said active region.

* * * * *